(12) United States Patent
Henning et al.

(10) Patent No.: US 7,915,703 B2
(45) Date of Patent: Mar. 29, 2011

(54) SCHOTTKY DIODES CONTAINING HIGH BARRIER METAL ISLANDS IN A LOW BARRIER METAL LAYER AND METHODS OF FORMING THE SAME

(75) Inventors: Jason Patrick Henning, Carrboro, NC (US); Allan Ward, Durham, NC (US)

(73) Assignee: Cree, Inc., Durham, NC (US)

( * ) Notice: Subject to any disclaimer, the term of this patent is extended or adjusted under 35 U.S.C. 154(b) by 140 days.

(21) Appl. No.: 12/465,279

(22) Filed: May 13, 2009

(65) Prior Publication Data

US 2010/0289109 A1 Nov. 18, 2010

(51) Int. Cl.
*H01L 29/47* (2006.01)
(52) U.S. Cl. ..... 257/471; 438/92; 438/570; 257/E27.04; 257/E29.338; 257/E21.368
(58) Field of Classification Search ............ 438/91, 438/92, 167, 560, 570, 983; 257/471, 474, 257/484, E27.04, E29.338, E21.368
See application file for complete search history.

(56) References Cited

U.S. PATENT DOCUMENTS

| 6,221,688 | B1 * | 4/2001 | Fujihira et al. ................ | 438/92 |
| 6,362,495 | B1 | 3/2002 | Schoen et al. | |
| 6,399,996 | B1 * | 6/2002 | Chang et al. ................ | 257/484 |
| 6,440,854 | B1 | 8/2002 | Rozbicki | |
| 2008/0029838 | A1 | 2/2008 | Zhang et al. | |

FOREIGN PATENT DOCUMENTS

| GB | 2 450 037 A | 12/2008 |
| WO | WO 97/33308 | 9/1997 |

OTHER PUBLICATIONS

Zhang et al., "Junction Barrier Schottky Diodes With Current Surge Capability", U.S. Appl. No. 12/124,341, filed May 21, 2008.
Notification of Transmittal of the International Search Report and the Written Opinion of the International Searching Authority, or the Declaration, International Search Report, Written Opinion of the International Searching Authority, PCT/US2010/034318, Jul. 13, 2010, 14 pages.
Yoshida et al., "Low On-Voltage Operation AlGaN/GaN Schottky Barrier Diode with a Dual Schottky Structure", IEICE Transactions on Electronics, Electronics Society, Tokyo, Japan, XP-001228959, vol. E88-C, No. 4, Apr. 2005, pp. 690-693.

* cited by examiner

*Primary Examiner* — Brook Kebede
(74) *Attorney, Agent, or Firm* — Myers Bigel Sibley & Sajovec, P.A.

(57) ABSTRACT

Fabrication of a Schottky diodes may include providing a Schottky contact layer containing a low barrier metal layer with spaced apart high barrier metal islands therein on a first surface of a substrate. A diode contact is formed on a second surface of the substrate that is opposite to the first surface. Formation of the Schottky contact layer may include providing a liquid mixture of a high barrier metal and a low barrier metal on the first surface of the substrate. Temperature and/or relative concentrations of the high and low barrier metals in the liquid mixture may be controlled to cause regions of the high barrier metal to solidify within the liquid mixture and agglomerate to form the spaced apart high barrier metal islands while inhibiting solidification of the low barrier metal. The temperature and relative concentrations may then be controlled to cause the low barrier metal to solidify and form the low barrier metal layer containing the high barrier metal islands.

26 Claims, 5 Drawing Sheets

SCHOTTKY DIODES CONTAINING HIGH BARRIER METAL ISLANDS IN A LOW BARRIER METAL LAYER AND METHODS OF FORMING THE SAME

FIELD OF THE INVENTION

The present invention relates to power semiconductor devices, and more particularly to Schottky diodes and their related fabrication.

BACKGROUND

Schottky barrier diodes are used extensively as output rectifiers in switching-mode power supplies and in other high-speed power switching applications, such as motor controls, for carrying large forward currents and supporting large reverse blocking voltages. Diodes exhibit low resistance to current flow in a forward direction and a very high resistance to current flow in a reverse direction. A Schottky barrier diode produces rectification as a result of nonlinear unipolar current transport across a metal semiconductor contact.

Silicon carbide (SiC) Schottky diodes are a promising technology because such devices can provide a low forward voltage drop, high breakdown voltage, and fast switching speed with essentially no reverse recovery current. However, the operational characteristics of a Schottky diode can depend heavily on the type of metal used for the Schottky contact. The power dissipated by a Schottky diode depends on the forward voltage drop and the reverse leakage current, both of which should be as low as possible. The forward voltage drop and the reverse leakage current are related to the barrier height of the Schottky contact, i.e., the magnitude of the potential barrier between the metal and semiconductor regions of the Schottky contact.

A low barrier height metal will have a low forward voltage drop and a large reverse leakage current. Conversely, a high barrier height metal will have a larger forward voltage drop and a smaller reverse leakage current. Therefore, it is desirable to have a Schottky diode which exhibits the forward characteristics of a small barrier height metal and the reverse characteristics of a large barrier height metal. A trench type Schottky diode can be configured to partially satisfy these conflicting design criteria by using lines of high barrier metals to pinch-off or electrically shield intervening trenched lines of low barrier metals. Although such trench type Schottky diodes may provide improved forward and reverse operational characteristics, their fabrication cost may be increased by the processes needed to form the trenches and high/low barrier metal lines, and their forward and reverse characteristics can be limited by the trench and high/low metal line feature sizes that are obtainable through available cost-effective fabrication processes.

SUMMARY

Some embodiments are directed to formation of Schottky diodes. A Schottky contact layer containing a low barrier metal layer with spaced apart high barrier metal islands therein is formed on a first surface of a substrate. A diode contact is formed on a second surface of the substrate that is opposite to the first surface.

Formation of the Schottky contact layer may include providing a liquid mixture of a high barrier metal and a low barrier metal on the first surface of the substrate. Temperature and/or relative concentrations of the high and low barrier metals in the liquid mixture may be controlled to cause regions of the high barrier metal to solidify within the liquid mixture and agglomerate to form the spaced apart high barrier metal islands while inhibiting solidification of the low barrier metal. The temperature and relative concentrations may then be controlled to cause the low barrier metal to solidify and form the low barrier metal layer containing the high barrier metal islands.

Nucleation catalyst sites that are configured to promote agglomeration of the high barrier metal in localized areas of the nucleation catalyst sites may be formed on the first surface of the substrate. The liquid mixture may then be formed across the first surface including the nucleation catalyst sites.

The Schottky contact layer may be formed by depositing a high barrier metal on the first surface of the substrate while heating the substrate to cause regional agglomeration and formation of the spaced apart high barrier metal islands. The low barrier metal may then be deposited across the first surface of the substrate including the high barrier metal islands to form the low barrier metal layer.

Some other embodiments are directed to Schottky diode structures that may be formed by one or more of these fabrication processes.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1:
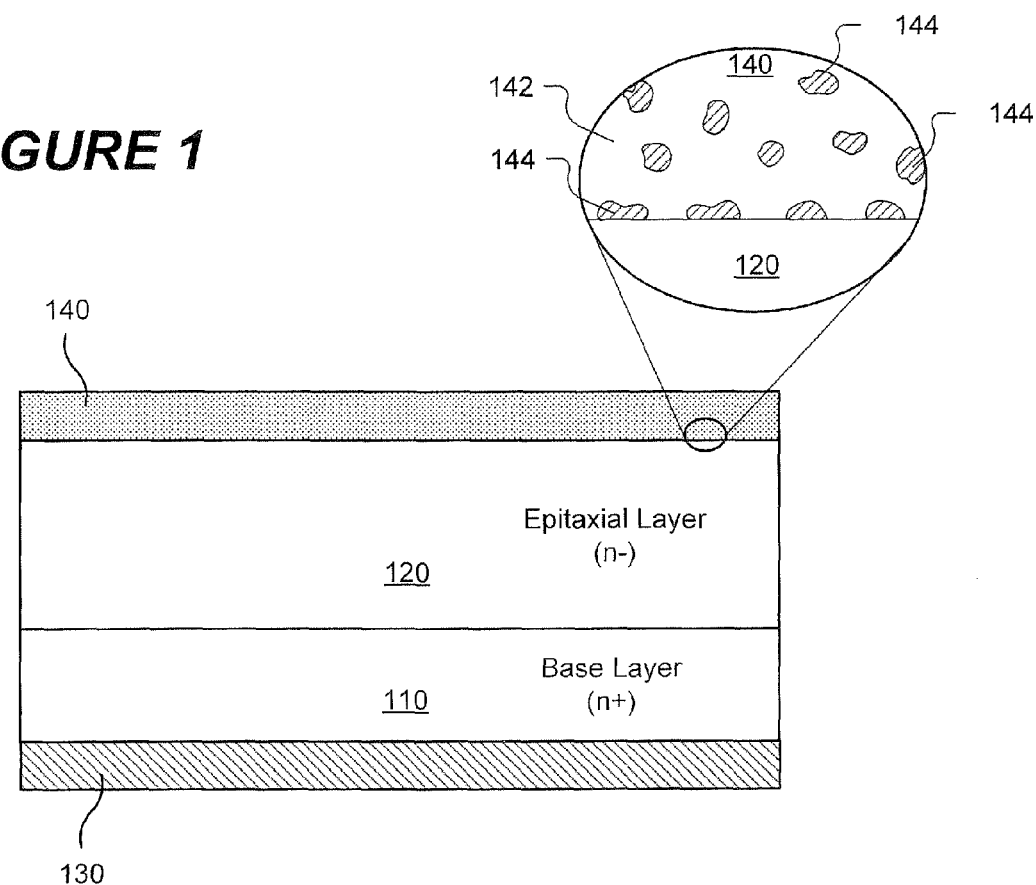
FIG. 1 is a cross-sectional view of a Schottky diode according to some embodiments.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Although various embodiments are described in the context of silicon carbide (SiC) Schottky diodes, the invention is not limited thereto as it may be embodied in Schottky diodes formed on silicon and other types of substrates.

FIG. 1 is a cross-sectional view of a Schottky diode 100 that is configured in accordance with some embodiments. Referring to FIG. 1, the Schottky diode 100 includes a relatively heavily doped base layer 110 of a first conductivity type (e.g., n+) and an epitaxial layer 120 of the same conductivity type but with a smaller concentration of majority carriers (e.g., n−). The epitaxial layer 120 and the base layer 110 are collectively referred to herein as a "substrate", although the substrate may only contain the epitaxial layer 120.

A cathode contact 130 is formed on a surface of the base layer 110 and an anode contact 140 is formed on a surface of the epitaxial layer 120. The cathode contact 130 can be a metal layer that is capable of forming an ohmic contact to the n-type silicon carbide base layer 110.

In accordance with some embodiments, the anode contact 140 includes a low barrier height metal layer 142 with spaced apart high barrier height metal islands 144 therein. Although some metal islands 144 may be spaced away from and not directly contact the epitaxial layer 120 (e.g., floating above the epitaxial layer 120), such as shown in FIG. 1, the metal layer does not necessarily include such floating metal islands 144.

When the Schottky diode 100 is forward biased, the low barrier height metal layer 142 provides a high current pathway with a low forward voltage drop. Conversely, when the Schottky diode 100 is reverse biased, the spaced apart high barrier height metal islands 144 deplete (pinch off) the surface of the epitaxial layer 120 so that the Schottky diode 100 can exhibit a small reverse leakage current. For brevity, the phrase "barrier height metal" will be abbreviated "barrier metal".

As will be explained in further detail below, the anode contact 140 may be formed from a liquid mixture of a high barrier metal and a low barrier metal. The liquid mixture may be formed on a planar surface of the epitaxial layer 120. The temperature of the liquid mixture and/or the relative concentrations of the high and low barrier metals are controlled to cause regions of the high barrier metal to solidify within the liquid mixture and agglomerate to form the spaced apart high barrier metal islands 144 while inhibiting solidification of the low barrier metal. The temperature and/or the relative concentrations of the high and low barrier metals remaining in the liquid mixture can then be further controlled to cause the low barrier metal to solidify and form the low barrier metal layer 142 containing the high barrier metal islands 144.

Because the high barrier metal islands 144 are formed by agglomeration of solidifying regions of the high barrier metal within the liquid mixture, the Schottky diode 100 may be formed using less complex, faster, and/or cheaper fabrication processes than may be needed to form trench type Schottky diodes having high barrier metal lines within substrate trenches. By controlling the temperature of the liquid mixture and/or the relative concentrations of the high and low barrier metals in the liquid mixture, the high barrier metal islands 144 may be formed with much smaller feature sizes than may be obtainable (within the typical low cost constraints) for the alternating trenches and high barrier metal lines of trench type Schottky diodes.

For example, by controlling the temperature of the liquid mixture and/or the relative concentrations of the high and low barrier metals, the high barrier metal islands 144 may be formed having an average width of less than 10 µm and, by more precise control of temperature and/or relative metal concentrations, may be formed with an average width of less than 1 µm.

Combinations of metals that may be used to form the liquid mixture may include, but are not limited to, nickel and silver, aluminum and germanium, aluminum and silicon, gold and chromium, gold and iron, chromium and scandium, palladium and platinum, and/or platinum and rhodium, where the high barrier metal islands are formed from the first one of the combination and the low barrier metal layer is formed from the second one of the combination. Various exemplary low and high barrier metals that may be used to form the mixture are shown in the table below with their associated barrier heights ($\Phi$):

| Metal Mixture | $\Phi_{low\ barrier\ metal}$ | $\Phi_{high\ barrier\ metal}$ |
|---|---|---|
| Ag—Ni | 4.3 ev | 5.1 ev |
| Al—Ge | 4.2 ev | 5.0 ev |
| Al—Si | 4.2 ev | 4.9 ev |
| Cr—Au | 4.5 ev | 5.1 ev |
| Fe—Au | 4.5 ev | 5.1 ev |
| Sc—Cr | 3.5 ev | 4.5 ev |
| Pd—Pt | 5.1 ev | 5.8 ev |
| Rh—Pt | 5.0 ev | 5.8 ev |

Figure 2:
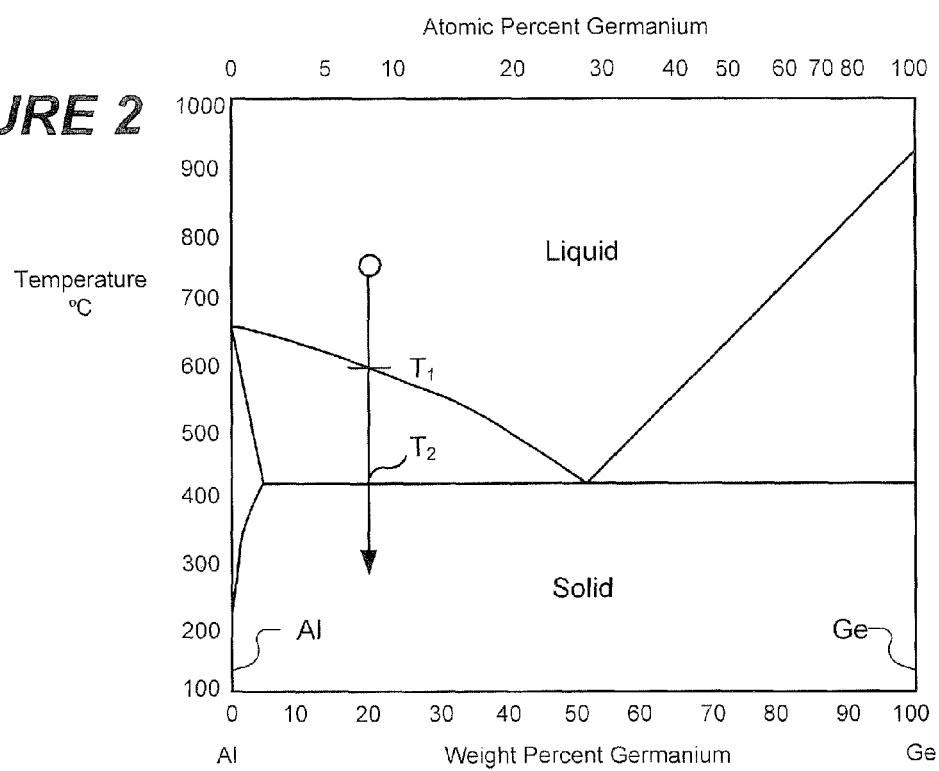
FIG. 2 is a phase diagram that illustrates various operations for controlling temperature and/or relative concentrations of high and low barrier metals in a liquid mixture to form a diode contact for a Schottky diode according to some embodiments.

FIG. 2 is a phase diagram that illustrates various operations for controlling temperature and/or relative concentrations of germanium high barrier metal and aluminum low barrier metal in the liquid mixture that forms the anode contact 140 in accordance with some embodiments. Referring to FIG. 2, for a 20 percent germanium mixture, the temperature of the liquid mixture can be maintained within the illustrated range between $T_1$ and $T_2$ (e.g., about 600° C. to about 420° C.) for a sufficient period of time to cause regions of the germanium high barrier metal to solidify within the liquid mixture and agglomerate to form spaced apart germanium high barrier metal islands while inhibiting solidification of the aluminum low barrier metal. After a sufficient density of germanium high barrier metal islands have formed, the temperature of the mixture is decreased (e.g., below about 420° C.) to solidify the aluminum low barrier metal surrounding the germanium high barrier metal islands.

Controlling the amount of time that the liquid mixture is maintained within the temperature range $T_1$ and $T_2$ can regulate the number of germanium high barrier metal islands that are formed. Moreover, maintaining the temperature closer to the upper temperature range $T_1$ may cause smaller germanium high barrier metal islands to be formed and, in contrast, maintaining the temperature closer to the lower temperature range $T_2$ may cause larger germanium high barrier metal islands to be formed. Furthermore, the rate at which the temperature is decreased from the upper temperature range $T_1$ to the lower temperature range $T_2$ can regulate the number and/or the variation in size of the germanium high barrier metal islands that are formed from the liquid mixture.

For example, the liquid mixture may be maintained at a substantially constant temperature within the range $T_1$ and $T_2$ to form the germanium high barrier metal islands with a relatively small size variation therebetween. The temperature of the liquid mixture can then be rapidly decreased below the solidification temperature of the aluminum low barrier metal to rapidly solidify the aluminum low barrier metal and, thereby, inhibit further agglomeration of the germanium high barrier metal into smaller sized islands.

Alternatively, the temperature of the liquid mixture may be more slowly decreased through the range $T_1$ and $T_2$ and below to the solidification temperature of the aluminum low barrier metal to increase the variation in size (randomness in size) of the germanium high barrier metal islands.

Regulating the size of the high barrier metal islands may provide improved operational characteristics for the Schottky diode 100. For example, having a more uniform high barrier metal islands size may provide improved reverse bias characteristics and/or reduce variability in the operational characteristic between the fabricated devices. However, having more randomness in the size of the high barrier metal islands may also provide improved operational characteristics for the Schottky diode 100 by, for example, reducing the effect of crystalline defects in the epitaxial layer 120 and/or the effect of other variability in the fabrication process steps on the arrangement and size of the high barrier metal islands and associated effect on the operational characteristics of the Schottky diode 100.

Exemplary operations that may be carried out to fabricate Schottky diodes according to various embodiments are described below with referenced to FIGS. 3-11. In some embodiments, nucleation catalyst sites are formed on the epitaxial layer 120 and then a liquid mixture is formed across the epitaxial layer 120 including the nucleation catalyst sites. The nucleation catalyst sites are configured to promote agglomeration of the high barrier metal islands from the liquid mixture in localized areas of the nucleation catalyst sites. The relative size and spacing between the layers and features illustrated in FIGS. 3-11 have been exaggerated for ease of illustration.

FIGS. 3-7 illustrate a sequence of cross-sectional views of intermediate structures formed during the fabrication of a Schottky diode, such as the Schottky diode 100 of FIG. 1, using nucleation catalyst sites to promote the formation and control the location of high barrier metal islands in accordance with some embodiments.

Figure 3:
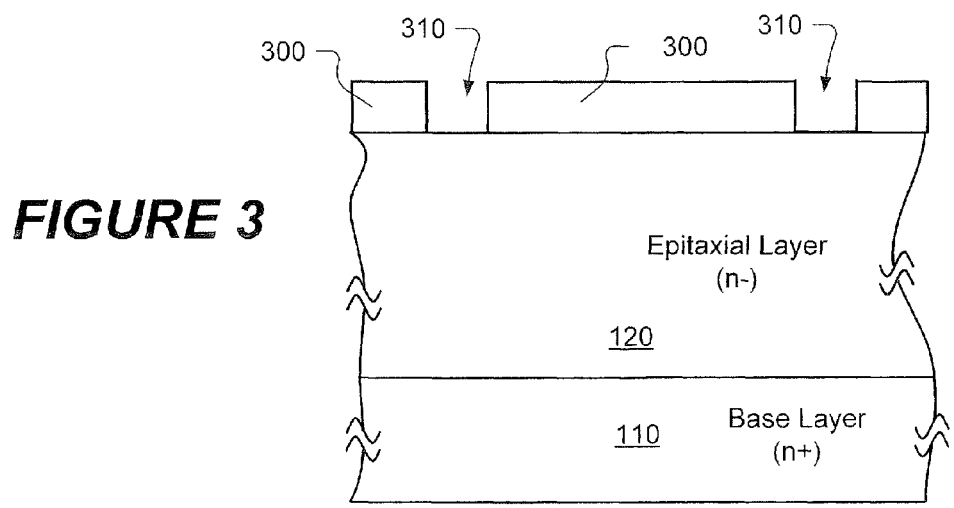
FIGS. 3-7 illustrate a sequence of cross-sectional views of intermediate structures formed during fabrication of the Schottky diode of FIG. 1 in accordance with some embodiments.

Referring to FIG. 3, a substrate is provided that has a base layer 110 and an epitaxial layer 120 which may be configured as described above for FIG. 1. A mask layer is formed on the epitaxial layer 120 and is patterned to form a mask pattern 300 having openings 310 that expose portions of the surface of the epitaxial layer 120. The mask pattern may, for example, be deposited and then etched to form the mask pattern 300.

Figure 4:
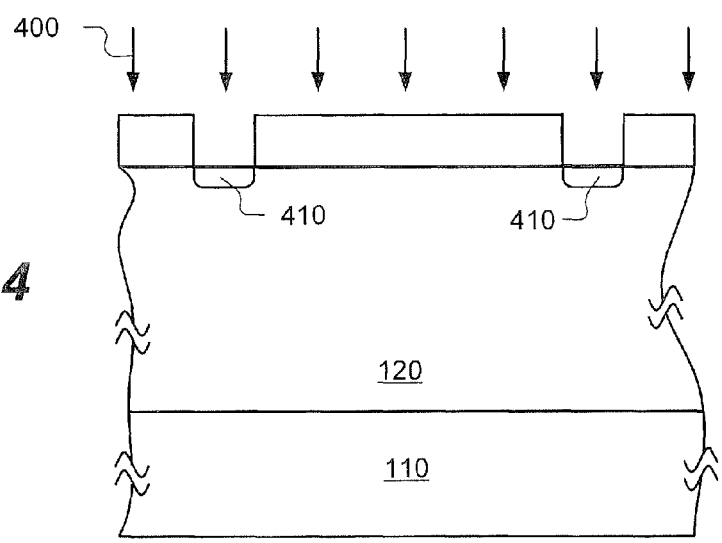

Referring to FIG. 4, using the mask pattern 300 as an implantation mask, impurity ions 400 are implanted through the openings 310 into surface area of the epitaxial layer 122 to form nucleation catalyst sites 410 that have a lower surface energy relative to the surface energy of adjacent major areas of the epitaxial layer 120 between the nucleation catalyst sites 410. Accordingly, the mask pattern 300 masks the other areas of the epitaxial layer 120 from implantation of the impurity ions to avoid changing the surface energy of those areas.

Figure 5:
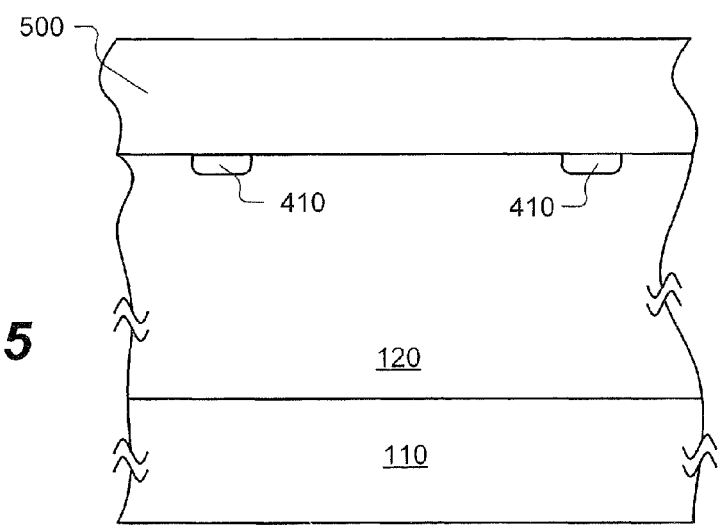

Referring to FIG. 5, the mask pattern 300 is removed (e.g., via etching and/or mechanical polishing). A liquid mixture layer 500 of a high barrier metal and a low barrier metal is formed on the epitaxial layer including the nucleation catalyst sites 410.

Figure 6:
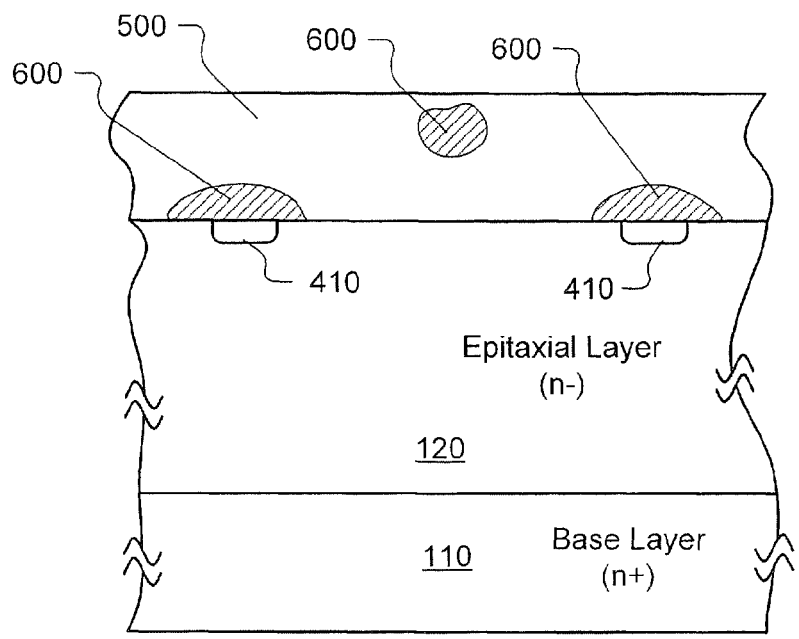

Referring to FIG. 6, the temperature of the liquid mixture layer 500 and/or the relative concentrations of the high and low barrier metals in the liquid mixture layer 500 are controlled to cause regions of the high barrier metal to solidify within the liquid mixture layer 500 and agglomerate to form spaced apart high barrier metal islands 600 while inhibiting solidification of the low barrier metal in the mixture. Because the surface energy of the nucleation catalyst sites 410 is lower than the other surface areas of the epitaxial layer, the solidifying high barrier metal contacting the surface of the epitaxial layer 120 will primarily agglomerate in the localized areas of the nucleation catalyst sites 410. Although some of the metal islands 600 may be spaced away from and not directly contact the epitaxial layer 120 (e.g., floating above the epitaxial layer 120), such as shown in FIG. 6, the metal layer does not necessarily include such floating metal islands 600.

Figure 7:
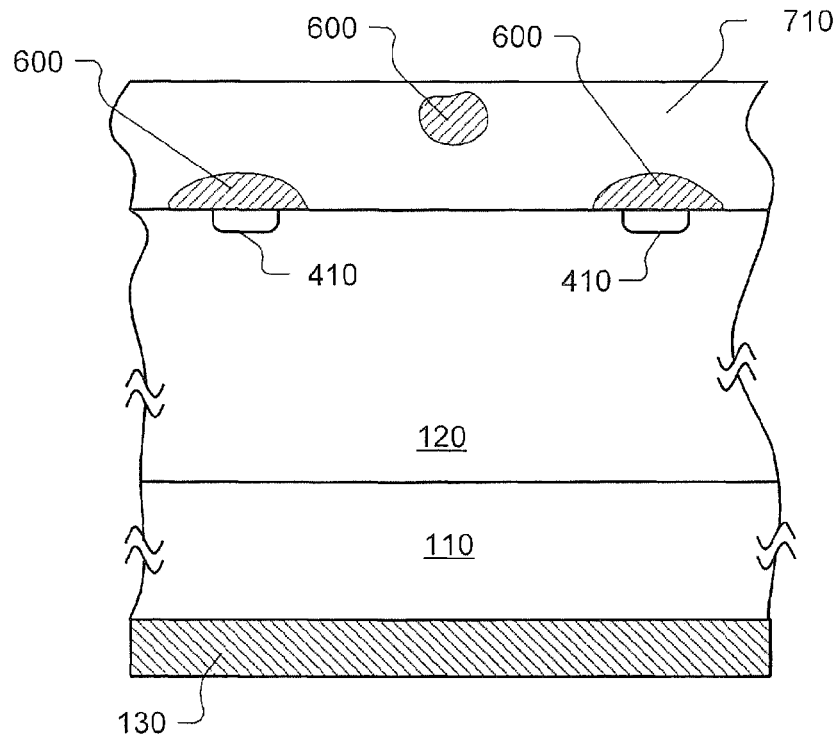

Referring to FIG. 7, the temperature and/or the relative concentrations of the high barrier metal and low barrier metal remaining in the liquid mixture layer 500 are then further controlled to cause the low barrier metal to solidify and form a low barrier metal layer 710 containing the high barrier metal islands 600. The solidified low barrier metal layer 710 containing the high barrier metal islands 700 functions as an anode contact 140. A cathode contact 130 is formed on a surface of the base layer 110. The cathode contact 130 can be formed from any type of metal that is capable of forming an ohmic contact to the n-type silicon carbide base layer 110.

Referring again to FIG. 4, nucleation catalyst sites may be formed through the openings 310 by roughening the surface of the epitaxial layer 120 through the openings, such as by etching the exposed surface while using the patterned layer 300 as an etching mask. The roughened surface of the epitaxial layer 120 at the nucleation catalyst sites can have a lower surface energy level than the smoother adjacent (non-exposed) areas of the epitaxial layer 120, which can cause the solidifying high barrier metal contacting the surface of the epitaxial layer to primarily agglomerate in the localized areas of the nucleation catalyst sites. The epitaxial layer 120 may be polished before forming the patterned layer 300 to increase the subsequent difference between the roughness of the etched nucleation catalyst sites and the adjacent non-etched surface of the epitaxial layer 120.

In some other embodiments, nucleation catalyst sites may be formed by selectively heating the surface of the epitaxial layer 120 to a sufficient temperature to permanently lower the surface energy at the nucleation catalyst sites while avoiding heating elsewhere that permanently lowers the surface energy of major portions of the substrate therebetween. For example, a laser beam may be controlled, such as by focusing the laser beam to about the area of individual ones of the nucleation catalyst sites, and modulating the laser beam on/off while scanning the laser beam across the surface of the epitaxial layer 120. The laser beam can be controlled to sequentially and rapidly heat individual ones of the nucleation catalyst sites to a sufficient temperature to damage the crystal structure of the illuminated area of the epitaxial layer 120 and lower the surface energy at the nucleation catalyst sites, and while avoiding heating of adjacent regions of the epitaxial layer 120 to a temperature that would be sufficient to similarly damage the crystal structure and lower the associated surface energy. The surface of the epitaxial layer 120 may be sufficiently heated by the laser to form silicide areas at the nucleation catalyst sites, which can promote formation of the high barrier metal islands at the individual silicide areas. The laser beam may be generated using a Nd Yttrium-Aluminum-Garnet (YAG) laser apparatus, a carbon dioxide laser apparatus, an excimer laser apparatus, and/or another laser apparatus.

Figure 8:
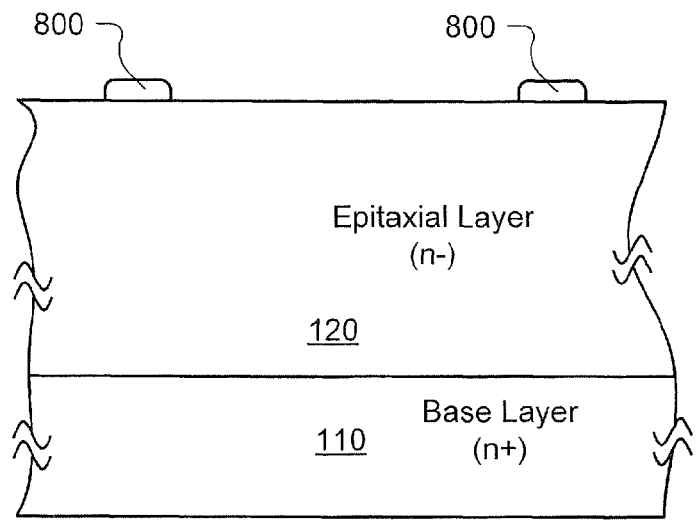
FIGS. 8 and 9 illustrate a sequence of cross-sectional views of intermediate structures formed during fabrication of another Schottky diode in accordance with some embodiments.
Figure 9:
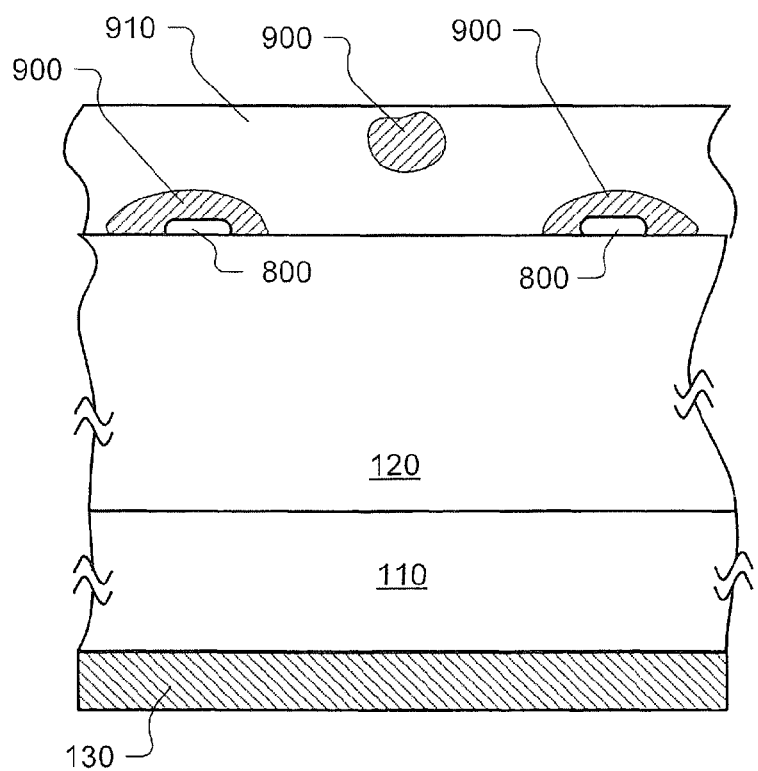

FIGS. 8 and 9 illustrate a sequence of cross-sectional views of intermediate structures that are formed during the fabrication of a Schottky diode, such as the Schottky diode 100 of FIG. 1, using another form of nucleation catalyst sites to promote the formation and control the location of high barrier metal islands in accordance with some embodiments.

Referring to FIG. 8, a substrate is provided that has a base layer 110 and an epitaxial layer 120 which may be configured as described above for FIG. 1. A nucleation catalyst pattern 800 is formed on a surface of the epitaxial layer 120 using, for example, a refractory metal. The nucleation catalyst pattern 800 may be formed by sputtering a refractory metal on the epitaxial layer 120. Alternatively or additionally, the nucleation catalyst pattern 800 may be formed by depositing a refractory metal layer on the epitaxial layer 120. The deposited refractory metal layer can then be patterned by forming a mask pattern that exposes portions of the refractory metal layer and then etching the exposed portions of the refractory metal layer to expose the epitaxial layer 120 while leaving behind the refractory metal pattern 800. The mask pattern can then be removed (e.g., by selective etching or polishing). Alternatively, a mask pattern may be selectively grown on the epitaxial layer 120, the nucleation catalyst material can be formed across the mask pattern, and the mask pattern and overlying portion of the nucleation catalyst layer can be removed to form the nucleation catalyst pattern 800.

Referring to FIG. 9, a liquid mixture layer of a high barrier metal and a low barrier metal is formed on the epitaxial layer including the nucleation catalyst pattern 800. The temperature of the liquid mixture layer and/or the relative concentrations of the high and low barrier metals in the liquid mixture layer are controlled to cause regions of the high barrier metal to solidify within the liquid mixture layer and agglomerate to form spaced apart high barrier metal islands 900 while inhibiting solidification of the low barrier metal in the mixture. Because individual ones of the nucleation catalyst pattern 800 can form inter-metallic bonds with the solidifying high barrier metal that is contacting the nucleation catalyst pattern 800, the solidifying high barrier metal will primarily agglomerate on individual ones of the nucleation catalyst pattern 800. The temperature and/or the relative concentrations of the high and low barrier metals are then further controlled to cause the low barrier metal to solidify and form a low barrier metal layer 910 containing the high barrier metal islands 900. \

A cathode contact 130 is formed on a surface of the base layer 110. As described above, the cathode contact 130 can be a metal layer that is capable of forming an ohmic contact to the n-type silicon carbide base layer 110.

Figure 10:
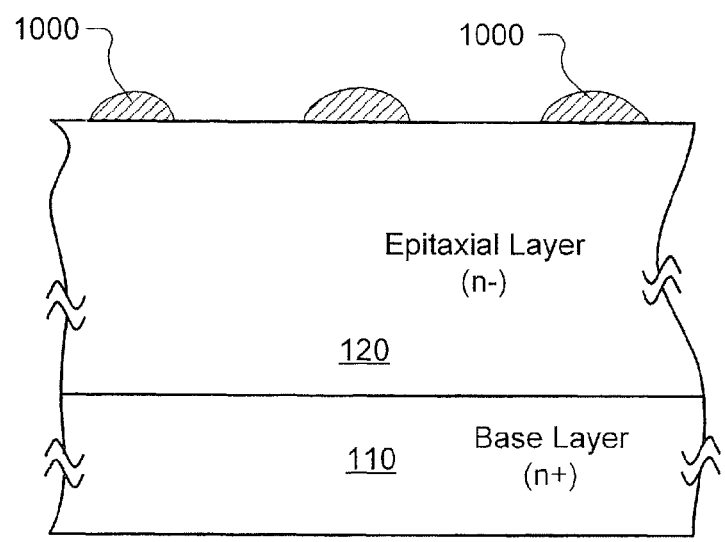
FIGS. 10 and 11 illustrate a sequence of cross-sectional views of intermediate structures formed during fabrication of another Schottky diode in accordance with some embodiments.
Figure 11:
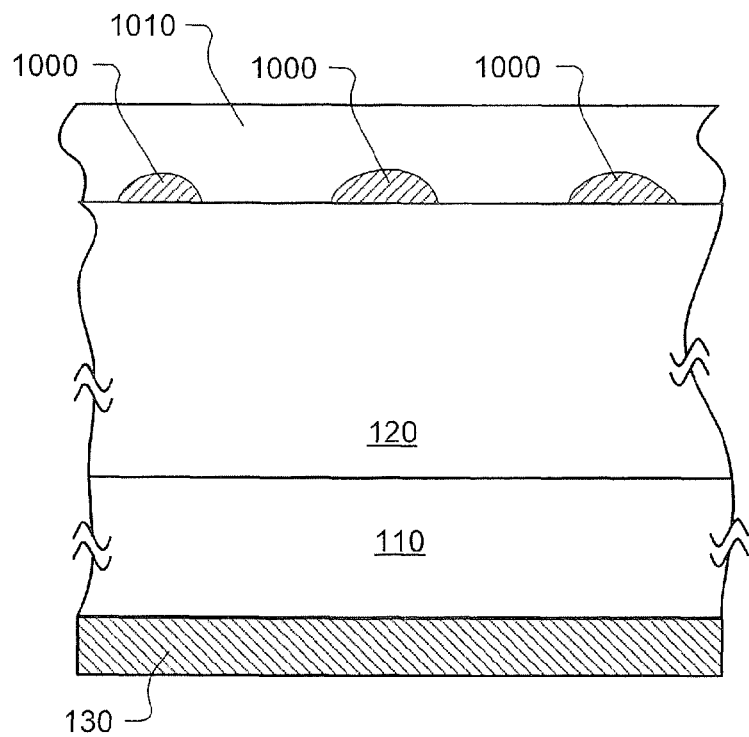

FIGS. 10 and 11 illustrate a sequence of cross-sectional views of intermediate structures formed during fabrication of another Schottky diode in accordance with some embodiments. Referring to FIG. 10, a high barrier metal is deposited on an epitaxial layer 120 of the substrate while heating the substrate to cause regional agglomeration and formation of spaced apart high barrier metal islands 1000. For example, the high barrier metal may be sputtered onto the epitaxial layer 120 while heating substrate to a temperature that maintains the high barrier metal in a liquid state so it can agglomerate into the spaced apart high barrier metal islands 1000. The deposited high barrier metal in the liquid state may locally agglomerate together using surface tension forces and/or using the reduced surface energy of any nucleation catalyst sites 410 that were preformed in the epitaxial layer 120 using one or more of the fabrication processes described above.

After agglomeration of a sufficient number and/or size of the spaced apart high barrier metal islands 1000 have formed, the temperature of the substrate can be reduced to solidify the high barrier metal islands 1000. A low barrier metal layer 1010 is then formed (e.g., deposited) across the epitaxial layer 120 including the high barrier metal islands 1000.

In some embodiments, the high barrier metal islands 1000 are formed by depositing gold on the epitaxial layer 120 and maintaining the epitaxial layer 120 above the melting point of gold (e.g., above about 1064° C.). After the deposited gold has agglomerated on the surface of the epitaxial layer 120 to form a sufficient number and/or size (e.g., average width of less than 10 µm) of spaced apart high barrier metal islands 1000, the temperature is reduced to solidify the gold high barrier metal islands 1000. The low barrier metal layer 1010 may then be formed by depositing Chromium across the epitaxial layer 120 including the gold high barrier metal islands 1000.

A cathode contact 130 can then be formed on a surface of the base layer 110. As described above, the cathode contact 130 can be a metal layer that is capable of forming an ohmic contact to the n-type silicon carbide base layer 110.

While embodiments of the present invention have been described with reference to particular sequences of operations, as will be appreciated by those of skill in the art, certain operations within the sequence may be reordered while still benefiting from the teachings of the present invention. Accordingly, the present invention should not be construed as limited to the exact sequence of operations described herein.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a Schottky diode, the method comprising:
    providing on a first surface of a substrate a Schottky contact layer containing a low barrier metal layer with spaced apart high barrier metal islands therein; and
    providing a diode contact on a second surface of the substrate that is opposite to the first surface.

2. The method of claim 1, wherein the Schottky contact layer is formed on a silicon carbide substrate.

3. The method of claim 1, wherein formation of the Schottky contact layer comprises:
    providing on the first surface of the substrate a liquid mixture of a high barrier metal and a low barrier metal; and
    controlling temperature and/or relative concentrations of the high and low barrier metals in the liquid mixture to cause regions of the high barrier metal to solidify within the liquid mixture and agglomerate to form the spaced apart high barrier metal islands while inhibiting solidification of the low barrier metal, and to thereafter cause the low barrier metal to solidify and form the low barrier metal layer containing the high barrier metal islands.

4. The method of claim 3, further comprising:
    maintaining the temperature of the liquid mixture within a first range that causes regions of the high barrier metal to solidify within the liquid mixture and agglomerate to form the spaced apart high barrier metal islands while inhibiting solidification of the low barrier metal, and then rapidly decreasing the temperature of the liquid mixture to rapidly solidify the low barrier metal while inhibiting further agglomeration of the high barrier metal into smaller sized high barrier metal islands.

5. The method of claim 3, wherein temperature and/or relative concentrations of the high and low barrier metals in the liquid mixture is controlled to cause regions of the high barrier metal to solidify within the liquid mixture and agglomerate to form the spaced apart high barrier metal islands with an average width of less than 10 µm.

6. The method of claim 5, wherein temperature and/or relative concentrations of the high and low barrier metals in the liquid mixture is controlled to cause regions of the high barrier metal to solidify within the liquid mixture and agglomerate to form the spaced apart high barrier metal islands with an average width of less than 1 µm.

7. The method of claim 3, further comprising:
    forming the liquid mixture from a combination of nickel and silver, aluminum and germanium, aluminum and silicon, gold and chromium, gold and iron, chromium and scandium, palladium and platinum, and/or platinum and rhodium, wherein the high barrier metal islands are formed from the first one of the combination and the low barrier metal layer is formed from the second one of the combination.

8. The method of claim 3, further comprising:
    providing nucleation catalyst sites on the first surface of the substrate; and
    providing the liquid mixture across the first surface including the nucleation catalyst sites, wherein the nucleation catalyst sites are configured to promote agglomeration of the high barrier metal in localized areas of the nucleation catalyst sites.

9. The method of claim 8, wherein:
    formation of the nucleation catalyst sites comprises providing a refractory metal pattern on the first surface of the substrate, wherein individual ones of the refractory metal pattern promote localized agglomeration of the high barrier metal.

10. The method of claim 9, wherein providing the refractory metal pattern comprises:
    depositing a refractory metal layer on the substrate;
    providing a mask pattern that exposes portions of the refractory metal layer; and
    etching the exposed portions of the refractory metal layer to form the refractory metal pattern.

11. The method of claim 8, wherein:
    formation of the nucleation catalyst sites comprises implanting impurity ions into the substrate at the nucleation catalyst sites to lower the surface energy at the nucleation catalyst sites while avoiding implantation relative to the surface energy of major portions of the substrate therebetween.

12. The method of claim 8, wherein:
    formation of the nucleation catalyst sites comprises selectively heating the nucleation catalyst sites to a sufficient temperature to permanently lower the surface energy at the nucleation catalyst sites while avoiding heating elsewhere that permanently lowers the surface energy of major portions of the substrate therebetween.

13. The method of claim 12, wherein:
    the substrate comprises silicon; and
    formation of the nucleation catalyst sites comprises selectively heating the nucleation catalyst sites to form silicide at the nucleation catalyst sites.

14. The method of claim 8, wherein:
    formation of the nucleation catalyst sites comprises roughening the first surface of the substrate at the nucleation catalyst sites relative to adjacent major surface areas of the substrate.

15. The method of claim 1, wherein formation of the Schottky contact layer comprises:
depositing a high barrier metal on the first surface of the substrate while heating the substrate to cause regional agglomeration and formation of the spaced apart high barrier metal islands; and
depositing the low barrier metal across the first surface of the substrate including the high barrier metal islands to form the low barrier metal layer.

16. The method of claim 15, wherein:
the deposited high barrier metal comprises gold; and
the deposited low barrier metal comprises chromium.

17. The method of claim 15, wherein the spaced apart high barrier metal islands have an average width of less than 10 µm.

18. A Schottky diode comprising:
a substrate;
a Schottky contact layer on a first surface of the substrate, the Schottky contact layer comprising a low barrier metal layer with spaced apart high barrier metal islands therein; and
a diode contact on a second surface of the substrate that is opposite to the first surface.

19. The Schottky diode of claim 18, wherein the Schottky contact layer has a planar surface contacting the substrate.

20. The Schottky diode of claim 18, wherein the spaced apart high barrier metal islands have an average width of less than 10 µm.

21. The Schottky diode of claim 20, wherein the spaced apart high barrier metal islands have an average width of less than 1 µm.

22. The Schottky diode of claim 18, wherein the high barrier metal islands comprises gold and the low barrier metal comprises chromium.

23. The Schottky diode of claim 18, wherein the high barrier metal islands comprise gold and the low barrier metal comprises chromium.

24. The Schottky diode of claim 18, further comprises nucleation catalyst structures that directly contact and reside between at least some of the spaced apart high barrier metal islands and the substrate.

25. The Schottky diode of claim 24, wherein the nucleation catalyst structures comprise spaced apart lower surface energy regions of the substrate relative to the surface energy of major portions of the substrate therebetween.

26. The Schottky diode of claim 24, wherein the nucleation catalyst structures comprise spaced apart silicide regions of the substrate.

* * * * *